United States Patent
Shindo

(10) Patent No.: US 11,600,589 B2
(45) Date of Patent: Mar. 7, 2023

(54) SEMICONDUCTOR DEVICE AND SEMICONDUCTOR DEVICE MANUFACTURING METHOD

(71) Applicant: LAPIS SEMICONDUCTOR CO., LTD., Kanagawa (JP)

(72) Inventor: Masanori Shindo, Kanagawa (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 17/163,610

(22) Filed: Feb. 1, 2021

(65) Prior Publication Data
US 2021/0242155 A1  Aug. 5, 2021

(30) Foreign Application Priority Data
Feb. 4, 2020 (JP) .............................. JP2020-017210

(51) Int. Cl.
*H01L 23/00* (2006.01)
*H01L 23/49* (2006.01)
*H01L 21/48* (2006.01)

(52) U.S. Cl.
CPC .......... *H01L 24/13* (2013.01); *H01L 21/4889* (2013.01); *H01L 23/49* (2013.01); *H01L 24/11* (2013.01); *H01L 2224/1355* (2013.01); *H01L 2224/13111* (2013.01); *H01L 2224/13139* (2013.01); *H01L 2224/13655* (2013.01)

(58) Field of Classification Search
CPC ..... H01L 24/13; H01L 21/4889; H01L 23/49; H01L 24/11; H01L 2224/13111; H01L 2224/13139; H01L 2224/1355; H01L 2224/13655; H01L 2224/02331; H01L 2224/02375; H01L 2224/0401; H01L 2224/05008; H01L 2224/05569; H01L 2224/05647; H01L 2224/13083
See application file for complete search history.

(56) References Cited

U.S. PATENT DOCUMENTS

| | | | |
|---|---|---|---|
| 6,806,570 B1 * | 10/2004 | Lee | H01L 24/12 |
| | | | 257/737 |
| 2016/0322322 A1 * | 11/2016 | Utsunomiya | H01L 24/11 |
| 2018/0294239 A1 * | 10/2018 | Sakata | H01L 24/16 |
| 2020/0035633 A1 * | 1/2020 | Mishra | H01L 23/3157 |

FOREIGN PATENT DOCUMENTS

| | | |
|---|---|---|
| JP | H09129680 A | 5/1997 |
| JP | 2019141908 A | 8/2019 |

* cited by examiner

*Primary Examiner* — Douglas W Owens
(74) *Attorney, Agent, or Firm* — Volentine, Whitt & Francos, PLLC

(57) ABSTRACT

A semiconductor device including a terminal that is formed using copper, that is electrically connected to a circuit element, and that includes a formation face formed with a silver-tin solder bump such that a nickel layer is interposed between the terminal and the solder bump, wherein the nickel layer is formed on a region corresponding to part of the formation face.

9 Claims, 5 Drawing Sheets

SEMICONDUCTOR DEVICE AND SEMICONDUCTOR DEVICE MANUFACTURING METHOD

CROSS-REFERENCE TO RELATED APPLICATION

This application is based on and claims priority under 35 USC 119 from Japanese Patent Application No. 2020-017210 filed on Feb. 4, 2020, the disclosure of which is incorporated by reference herein.

BACKGROUND

Technical Field

The present disclosure relates to a semiconductor device and a semiconductor device manufacturing method.

Known literature relating to terminal reliability includes Japanese Patent Application Laid-Open (JP-A) No. H09-129680, in which a semiconductor pellet is disclosed. In the semiconductor pellet disclosed in JP-A No. H09-129680, a barrier metal layer configured including a diffusion prevention layer and a junction layer is laid underneath a solder bump formed on the semiconductor pellet. The junction layer is divided into plural segments. In JP-A No. H09-129680 the thermal expansion of the junction layer is reduced as a result of dividing the junction layer into the plural segments. Stress arising in the passivation film as a result of the difference between the respective thermal expansion coefficients of the barrier metal layer and a passivation film can accordingly be reduced, enabling the occurrence of peeling and cracking of the passivation film to be prevented.

Known background art concerned with connection reliability when a terminal of a specific material and a solder of a specific material are welded together includes JP-A No. 2019-141908, in which a soldering material is disclosed. In order to suppress the development of Kirkendall voids, the soldering material disclosed in JP-A No. 2019-141908 contains Sn, the intermetallic compound $CU_6Sn_5$, and Cu. The soldering material has a structure in which the Sn, the intermetallic compound $CU_6Sn_5$, and the Cu are diffused, and effectively all of the Cu forms compounds with the Sn and other substances during welding. Kirkendall voids are voids that develop when atomic vacancies (lattice defects) that form as a result of unequal diffusion congregate instead of being eliminated during metal-to-metal welding. In the case of the interface between Sn and Cu, since Sn has a lower rate of diffusion than Cu, vacancies may congregate at the interface between the intermetallic compound and the Cu.

Explanation follows regarding connection reliability and conductivity in cases in which a solder bump is formed on a columnar shaped terminal (hereafter simply referred to as a terminal), with reference to FIG. 5A and FIG. 5B. FIG. 5A and FIG. 5B illustrate an example of a case in which the material of the terminal is copper (hereafter, Cu), and the material of the solder bump is silver-tin (hereafter, Sn—Ag). Hereafter, a configuration including the terminal and the solder bump formed on the terminal is referred to as a "columnar body". FIG. 5A illustrates a structure of a columnar body in a case in which a solder bump 12 is formed directly on a terminal 19 without laying a barrier metal therebetween. FIG. 5B illustrates a structure of a columnar body in a case in which a barrier metal configured by a nickel (hereafter, Ni) layer 20 is laid between the terminal 19 and the solder bump 12.

In the columnar body illustrated in FIG. 5A, voids 25 might develop as a result of the Kirkendall effect. If Kirkendall voids develop, an interface between the terminal 19 and the solder bump 12 becomes brittle, which may be detrimental to connection reliability. FIG. 5B illustrates a columnar body in which the terminal 19 and the solder bump 12 are connected through the Ni, serving as a barrier metal, in order to suppress the development of such voids 25. The columnar body illustrated in FIG. 5B may be detrimental to the performance of a circuit element (device) formed on the semiconductor device. This would be due to a reduction in the conductivity of the terminal 19 caused by the interposed nickel.

Namely, although a columnar body formed to a semiconductor device should be nickel-free in order to improve conductivity, an interposed barrier metal is required in order to improve connection reliability. Although it is generally considered difficult to realize both these objectives at the same time, an ideal solution would be a columnar body that achieves both connection reliability and conductivity.

SUMMARY

In consideration of the above circumstances, exemplary embodiments of the present invention relate to providing a semiconductor device and a semiconductor device manufacturing method capable of achieving both connection reliability and conductivity between a copper terminal and a silver-tin solder bump in cases in which an electrode including the terminal and the solder bump is formed on wiring.

In order to address the above issues, a semiconductor device according to an aspect of the present invention includes a terminal that is formed using copper, that is electrically connected to a circuit element, and that includes a formation face formed with a silver-tin solder bump such that a nickel layer is interposed between the terminal and the solder bump. The nickel layer is formed on a region corresponding to part of the formation face.

In order to address the above issues, a semiconductor device according to another aspect of the present invention includes a terminal that is formed using copper and that is electrically connected to a circuit element, a nickel layer that is formed on a region corresponding to part of an upper face of the terminal, and a silver-tin solder bump that is formed on exposed copper at the upper face and also on an upper portion of the nickel layer.

In order to address the above issues, a semiconductor device manufacturing method according to an aspect of the present invention includes a process of forming a circuit element including wiring on a semiconductor wafer, the circuit element including an opening corresponding to part of the wiring so as to externally expose the wiring, a process of forming a terminal at the opening using copper, and a process of forming a nickel layer on part of an upper face of the terminal.

The aspects of the present invention are capable of providing a semiconductor device and a semiconductor device manufacturing method that exhibit the advantageous effect of achieving both connection reliability and conductivity between a copper terminal and a silver-tin solder bump in cases in which an electrode including the terminal and the solder bump is formed on wiring.

DETAILED DESCRIPTION

Detailed explanation follows regarding exemplary embodiments of the present disclosure, with reference to the drawings. In the following explanation, an example is given of a case in which a semiconductor device according to the present disclosure is applied to a chip size package (CSP), and terminals are formed on a circuit face of the CSP.

First Exemplary Embodiment

Figure 1:
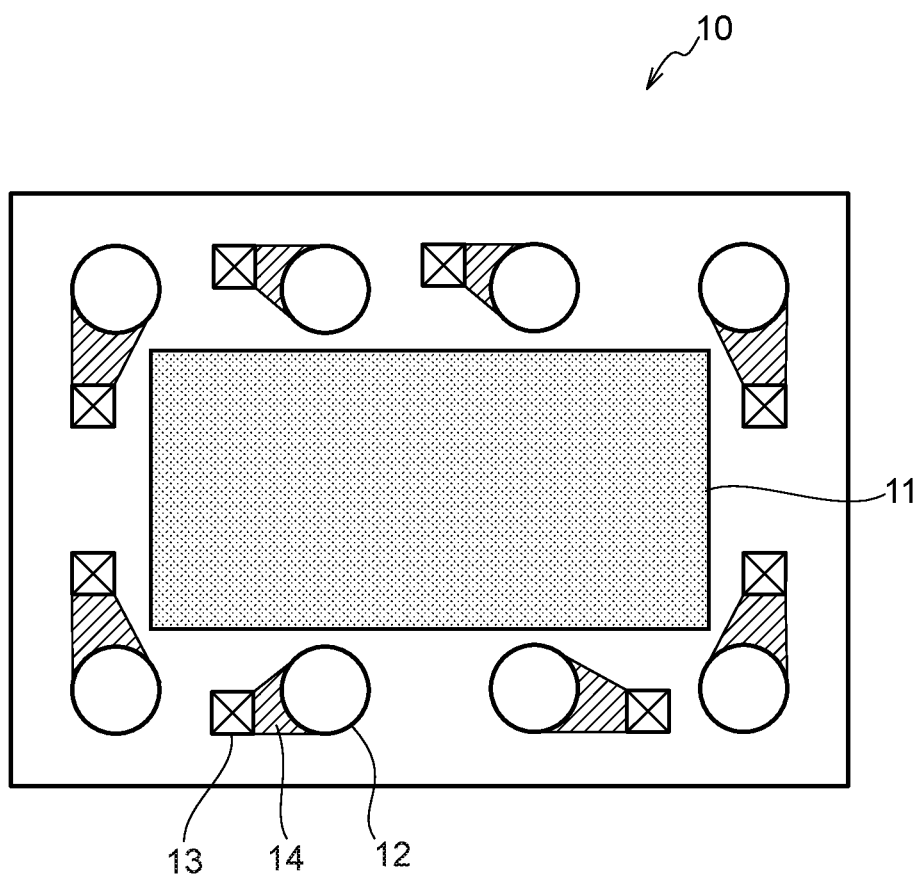
FIG. 1 is a plan view, illustrating an example of configuration of a back face of a semiconductor device according to an exemplary embodiment.

FIG. 1 is a plan view of a back face of a semiconductor device 10, serving as a CSP according to the present exemplary embodiment. As illustrated in FIG. 1, the semiconductor device 10 is configured including a circuit element region 11, solder bumps 12, pads 13, and wiring 14.

The circuit element region 11 is a placement region for active devices such as transistors and diodes, and passive devices such as resistors and capacitors, for implementing the intended functionality of the semiconductor device 10.

The pads 13 are connection regions formed from a conductor in order to connect to external components, and are connected to the circuit element region 11 by non-illustrated wiring that is formed from a conductor. The wiring 14 is what is referred to as rewiring that is formed from a conductor, and is connected to terminals used to connect the pads 13 to the external components, not illustrated in the drawings. The solder bumps 12 are weldable members provided on the terminals, and are formed in cases in which the semiconductor device 10 is to be mounted to a printed circuit board or the like. Note that although an example in which the semiconductor device 10 includes the solder bumps 12 is given in the present exemplary embodiment, there is no limitation thereto. The semiconductor device 10 may be configured without the solder bumps 12 such that the terminals, described later, are exposed.

Note that pads (corresponding to the pads 13) on a semiconductor circuit face of a processed wafer are open to the exterior through openings in a passivation layer. In a normal package, bare chips obtained by dicing a wafer are connected to a mounting face of a printed circuit board or the like by for example bonding. However, in a CSP, a connection structure is built on the chips prior to dicing. Namely, a conductor rewiring layer (corresponding to the wiring 14) is formed on the pads on the semiconductor circuit face, and the surface is sealed with a sealing resin so as to leave connection portions (the terminals, described later) in the rewiring layer. Hemispherical solder bumps (corresponding to the solder bumps 12) or the like are formed on top of the connection portions as required.

Figure 2A:
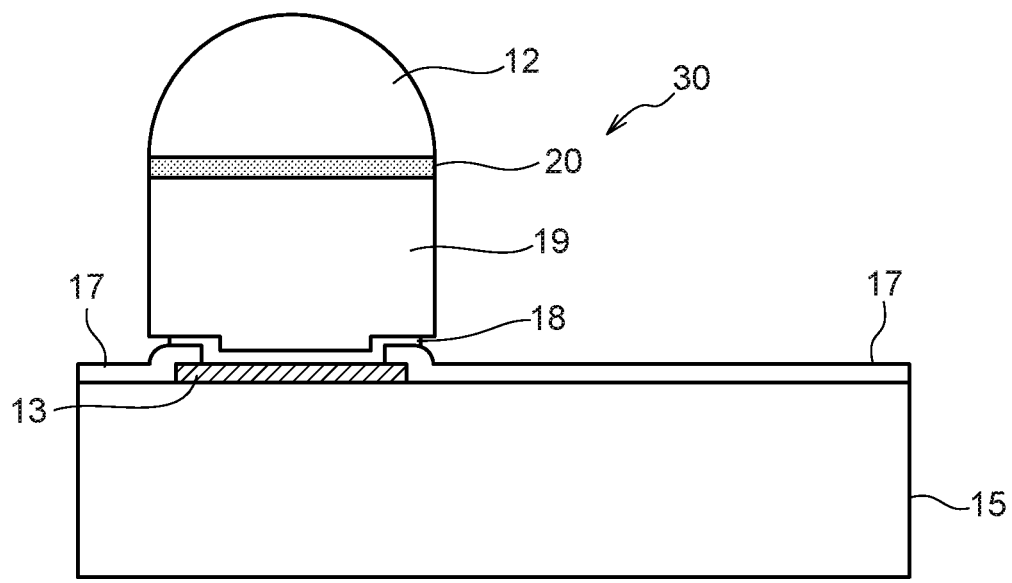
FIG. 2A is a cross-section illustrating an example of configuration of a columnar body of a semiconductor device according to an exemplary embodiment in which rewiring is not performed.
Figure 2B:
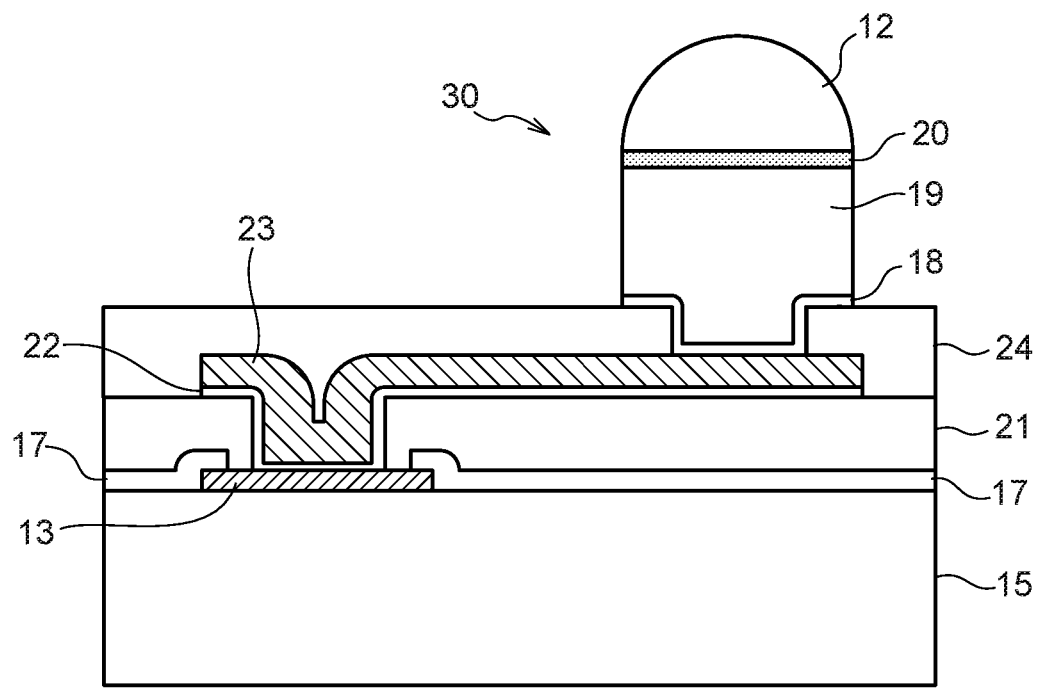
FIG. 2B is a cross-section illustrating an example of configuration of a columnar body of a semiconductor device according to an exemplary embodiment in which rewiring is performed.

Next, explanation follows regarding the connection structure of the semiconductor device 10, with reference to FIG. 2. Columnar bodies (composite bodies including a terminal and a solder bump) are formed at predetermined locations on the circuit face of the semiconductor device 10. There are two methods for forming these columnar bodies. Of these two methods, FIG. 2A illustrates a first formation method in which a columnar body is formed directly on top of a pad 13, and FIG. 2B illustrates a second formation method in which a columnar body is formed on an upper portion of wiring 23 serving as rewiring routed from a pad 13. In other words, the first formation method is a formation method that does not employ rewiring, whereas the second formation method is a formation method that employs rewiring.

Explanation follows regarding the first formation method, with reference to FIG. 2A. As illustrated in FIG. 2A, in the first formation method, the pad 13 and an insulating film 17 are formed on a circuit face of a semiconductor substrate 15, and a columnar body 30 is then formed on an upper portion of the pad 13. There is no particular limitation to the material of the semiconductor substrate 15, and a silicon (Si) substrate is employed in the present exemplary embodiment. The insulating film 17 is for example formed of a silicon nitride film (SiN film), or a silicon dioxide film ($SiO_2$ film). The pad 13 is for example formed of aluminum (Al), and an opening in the insulating film 17 is provided at part of a region corresponding to the pad 13. A seed layer 18 may be formed between the pad 13 and the columnar body 30. The seed layer 18 is a conductor for plating in a later process, and is for example configured by a laminated titanium (Ti) and copper (Cu) structure.

The columnar body 30 includes a terminal 19, a solder bump 12, and a nickel layer 20 formed between an upper face of the terminal 19 and the solder bump 12. In the present exemplary embodiment, the terminal 19 is formed of Cu, and the solder bump 12 is formed of Sn—Ag. Explanation regarding the formation method of the nickel layer 20 formed on part of the upper face of the terminal 19 in the semiconductor device 10 will be given in detail later.

Explanation follows regarding the second formation method, with reference to FIG. 2B. As illustrated in FIG. 2B, the semiconductor substrate 15, the pad 13, and the insulating film 17 have similar structures to those in the first formation method, and so are formed by a similar method to the first formation method. However, in the second formation method, a lower layer insulating film 21 is further formed on an upper portion of the insulating film 17, the wiring 23 serving as rewiring is formed on an upper portion of the lower layer insulating film 21, and a surface layer insulating film 24 is formed on an upper portion of the wiring 23. A seed layer 22 may be laid between the wiring 23 and the lower layer insulating film 21. Configuration of the columnar body 30 is similar to that in the first formation method, and so explanation thereof is omitted.

Next, detailed explanation follows regarding configuration of the columnar body 30 according to the present exemplary embodiment. As described above, in the columnar body 30 according to the present exemplary embodiment, Cu is employed as the material of the terminal 19, and Sn—Ag is employed as the material of the solder bump 12. As previously described, when these materials are combined, achieving both connection reliability and conductivity between the terminal 19 and the solder bump 12 is an issue when attempting to suppress Kirkendall voids and also eliminate nickel. In the present exemplary embodiment, the nickel layer 20 is therefore formed over a limited region corresponding to part of the upper face of the terminal 19, instead of being formed over the entire upper face.

Figure 3A:
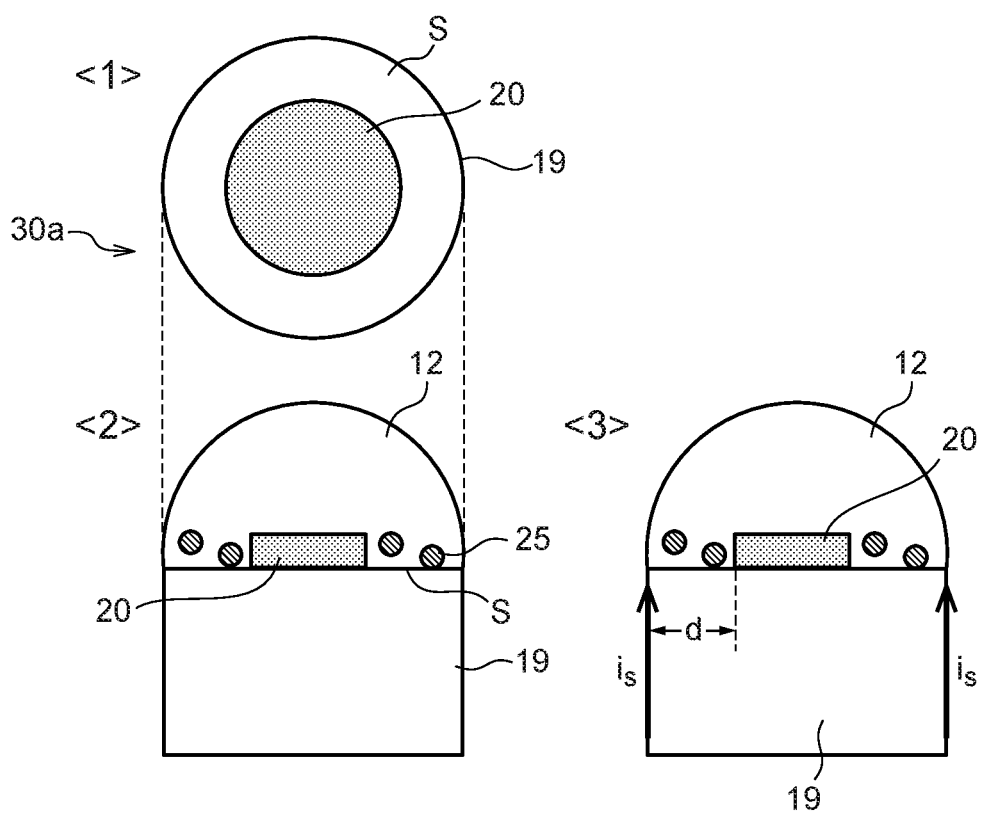
FIG. 3A is a cross-section illustrating an example of configuration of a columnar body according to a first exemplary embodiment.
Figure 3B:
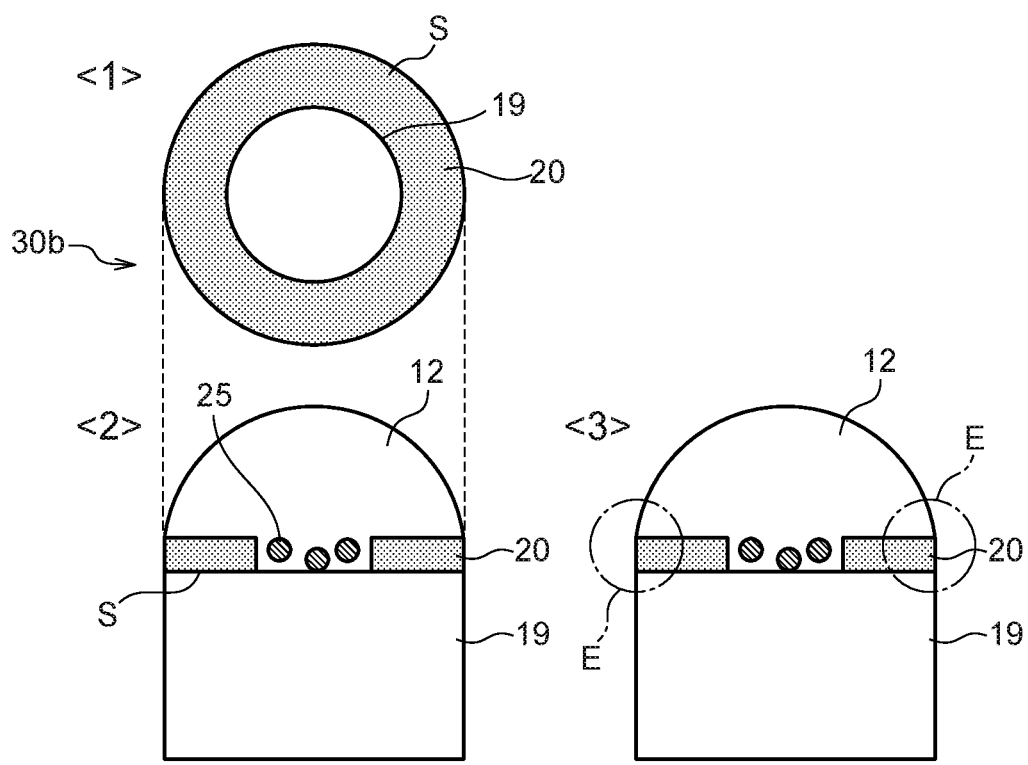
FIG. 3B is a cross-section illustrating an example of configuration of a columnar body according to a modified example of the first exemplary embodiment.

More specific explanation following regarding a columnar body 30a included in the semiconductor device 10 according to the present exemplary embodiment, including explanation regarding a formation method of the nickel layer 20, with reference to FIG. 3A and FIG. 3B. FIG. 3A illustrates an example of a formation method of the columnar body 30a according to the present exemplary embodiment. FIG. 3A <1> is a plan view, and FIG. 3A <2> is a cross-section of the columnar body 30a. Note that illustration of the solder bump 12 is omitted from FIG. 3A <1>. As illustrated in FIG. 3A <1>, an upper face S of the terminal 19 has a circular shape. Note that the shape of the upper face S is not limited to a circular shape, and may for example be a rectangular shape. As illustrated in FIG. 3A <1>, in the present exemplary embodiment the nickel layer 20 has a circular shape that is concentric to the upper face S but has a smaller diameter than the upper face S. Namely, the solder bump 12 and the terminal 19 are connected together through the nickel layer 20 in a specific region including the center of the upper face S, and the solder bump 12 and the terminal 19 are directly connected together in a specific region including the periphery of the upper face S.

Voids 25 are schematically illustrated by shaded circles in FIG. 3A <2>. Since the solder bump 12 and the terminal 19 are directly connected together in the specific region including the periphery of the upper face S, there is a possibility of Kirkendall voids developing in this region. Note that the voids 25 conceptually illustrate positions where such Kirkendall voids might develop, and do not imply that such voids are inevitable. As illustrated in FIG. 3A, in the present exemplary embodiment, the solder bump 12 and the terminal 19 are directly connected together over a limited region, and so even if Kirkendall voids were to develop, they would not be significant enough to affect connectivity.

As illustrated in FIG. 3A <2>, in contrast to a peripheral edge portion of the upper face S, the solder bump 12 is connected to the terminal 19 through the nickel layer 20 at a central portion of the upper face S. Thus, voids 25 are in principle less liable to occur at this central portion. Although conductivity issues at the nickel layer 20 are anticipated, the nickel layer 20 occupies a limited proportion of the upper face S, and so such conductivity issues are limited in nature when compared to the technology of the comparative example described previously.

Furthermore, in cases in which a signal passing through the columnar body 30a is an AC signal, a current is of the signal flows along a side face of the columnar body 30a as illustrated in FIG. 3A <3> due to the Skin effect, such that most of the current flow does not pass through the nickel layer 20, thereby alleviating the issues with conductivity. Moreover, raising the frequency causes more of the current $i_s$ to concentrate at the side face of the columnar body 30, thereby enabling a distance d from the side face of the terminal 19 to the nickel layer 20 to be reduced. In other words, the distance d may be determined based on the frequency of the AC signal that flows in the columnar body 30a.

Next, explanation follows regarding a manufacturing method of the semiconductor device 10 according to the present exemplary embodiment. The following explanation describes as far as completion of formation of the pad 13 and the insulating film 17 on the circuit face of the semiconductor substrate 15, namely as far as a stage where wafer processing is complete, but a rewiring process has yet to be performed.

First, the lower layer insulating film 21 is formed. Namely, for example, an insulating film is formed on the circuit face using a material with thermosetting properties, and patterning thereof is performed by photolithography. The material is then thermoset.

Next, the wiring 23, this being rewiring, is formed on an upper portion of the lower layer insulating film 21. Namely, a conductor serving as the seed layer 22 is formed on the circuit face, and patterning thereof is performed by photolithography. A resist is then coated onto the circuit face to form a mask, which is plated with Cu to form the wiring 23. The resist and seed layer are then removed.

Next, the surface layer insulating film 24 is formed. Namely, for example, an insulating film is formed on the circuit face using a material with thermosetting properties, and patterning thereof is performed by photolithography. The material is then thermoset.

Next, the terminal 19 is formed. Namely, after having formed the seed layer 18, Cu plating is performed in a first photolithography process to form the terminal 19 on the seed layer 18. Ni plating is then performed in a second photolithography process to form the nickel layer 20 on the terminal 19. As previously described, the nickel layer 20 is formed on a limited part of the upper face S of the terminal 19 in the present exemplary embodiment. A resist employed to form a mask is then removed.

Next, the solder bump 12 is formed. Namely, solder (Sn—Ag in the present exemplary embodiment) is printed and reflow soldered on the circuit face, and a resist and seed layer employed in this process are then removed. Note that this process is omitted in cases in which the semiconductor device 10 is configured such that terminal 19 is directly exposed and the solder bump 12 is not employed.

Note that a difference between the manufacturing method of the semiconductor device according to the related art and the manufacturing method of the semiconductor device 10 according to the present exemplary embodiment lies in that the manufacturing method of the semiconductor device 10 according to the present exemplary embodiment includes the second photolithography process that is not performed in the manufacturing method of the semiconductor device according to the related art. This is since it is necessary to pattern the nickel layer 20 in a different shape to that of the upper face S in order to form the nickel layer 20 to a limited part of the upper face of the terminal 19.

The above-described manufacturing method of the semiconductor device 10 is a manufacturing method applied in cases in which the wiring 23 is included as rewiring. In cases in which the wiring 23 is not included, a manufacturing method may be applied in which formation of the lower layer insulating film 21, formation of the wiring 23, and formation of the surface layer insulating film 24 are omitted from the above-described manufacturing method, and the processing from formation of the terminal 19 onward is performed.

Modified Example of First Exemplary Embodiment

Explanation follows regarding a columnar body 30b provided to the semiconductor device 10 according to the present exemplary embodiment, with reference to FIG. 3B. FIG. 3B illustrates an example of a formation method of the columnar body 30b according to a modified example. FIG. 3B <1> is a plan view, and FIG. 3B <2> is a cross-section of the columnar body 30b. Note that illustration of the solder bump 12 is omitted from FIG. 3B <1>. As illustrated in FIG. 3B <1>, in the present exemplary embodiment, the nickel layer 20 is formed in an annular shape (donut shape) concentric to the upper face S. The periphery of the annular shape is laid so as to run around the periphery of the terminal 19. The solder bump 12 and the terminal 19 are directly connected together through the hole in this annular shape.

Thus, the issue of conductivity is alleviated at a specific region including the center of the upper face S for similar reasons to those in the first exemplary embodiment. Moreover, the issue of connection reliability is alleviated at a specific region including a peripheral portion of the upper face S for similar reasons to those in the first exemplary embodiment. Note that investigation by testing, simulation, and the like has revealed that connection reliability is often a particular issue in the columnar body 30 at an end portion E illustrated in FIG. 3B <3>. Namely, by carrying out temperature cycle testing on a printed circuit board or the like on which a semiconductor device is mounted through a columnar body, it has been found that a high proportion of connection faults occur as a result of a state in the vicinity of the end portion E in particular. This is thought to be due to a concentration of stress in the vicinity of the end portion E. The present modified example addresses this with a structure in which voids 25 are less liable to develop in the vicinity of the end portion E, thereby enabling a deterioration in the strength of the columnar body due to such voids 25 to be effectively suppressed.

Second Exemplary Embodiment

Figure 4A:
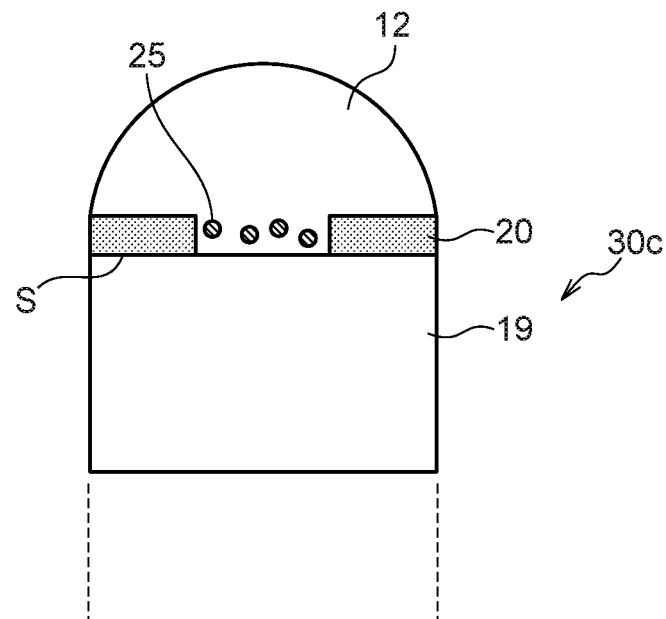
FIG. 4A is a cross-section illustrating an example of configuration of a columnar body according to a second exemplary embodiment.
Figure 4B:
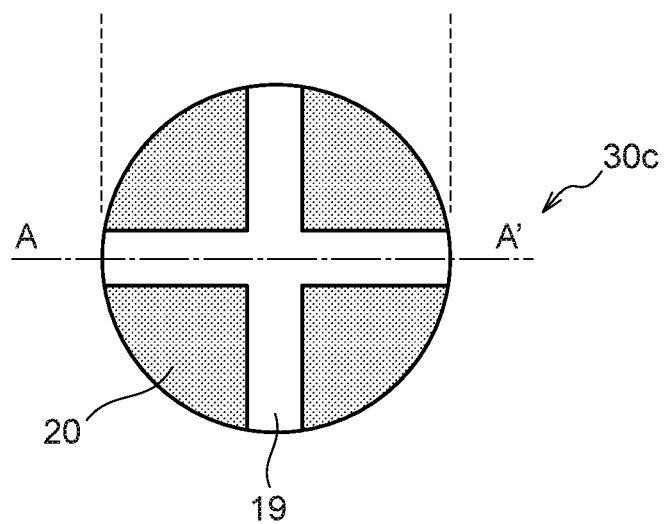
FIG. 4B is a plan view illustrating an example of configuration of a columnar body according to the second exemplary embodiment.
Figure 5A:
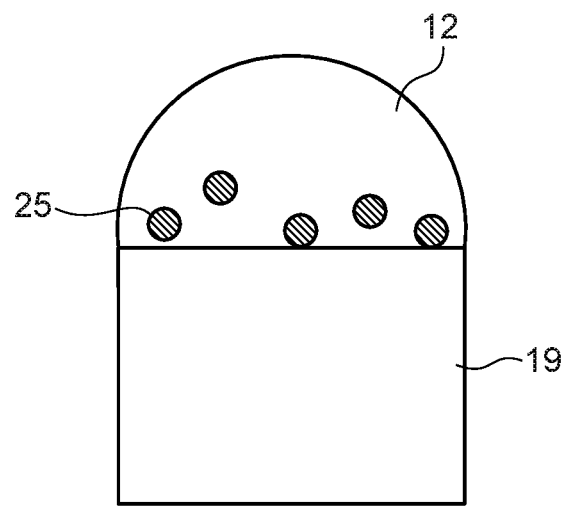
FIG. 5A is a cross-section illustrating configuration of a columnar body according to a comparative example.
Figure 5B:
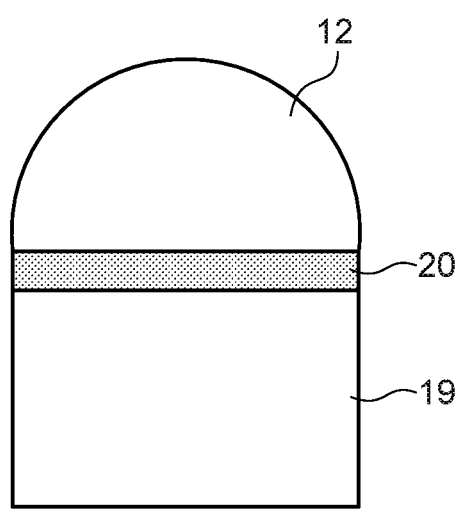
FIG. 5B is a cross-section illustrating configuration of a columnar body according to a comparative example.

Explanation follows regarding a columnar body 30c included in a semiconductor device 10 according to a second exemplary embodiment, with reference to FIG. 4A and FIG. 4B. FIG. 4A is a cross-section, and FIG. 4B is a plan view of the columnar body 30c. The cross-section illustrated in FIG. 4A is a cross-section sectioned along line A-A' in FIG. 4B.

As illustrated in FIG. 4B, a region where the nickel layer 20 is not present on the columnar body 30c is formed in a cross shape in plan view, such that the nickel layer 20 is disposed in quadrant shapes in each of four directions. Similarly to the exemplary embodiment described above, this structure enables both connection reliability and conductivity between the terminal and the solder bump to be achieved.

Namely, in the exemplary embodiment previously described, the nickel layer 20 is disposed so as to occupy a contiguous specific region. However, the nickel layer 20 may be distributed between discrete shapes, as in the columnar body 30c according to the present exemplary embodiment. Consideration should be given to the proportion of the upper face S to be occupied by the nickel layer 20, but this proportion may be determined according to, for example, which out of connection reliability or conductivity is being prioritized. As an example, it has been found in investigation through testing, simulations, and the like that in cases in which connection reliability is being prioritized, a proportion is one third or greater (and of course less than 100%) is sufficient.

Note that although examples have been given in which the terminal has a columnar shape in the above exemplary embodiments, there is no limitation thereto. For example, the exemplary embodiments may also be applied in cases in which a solder bump 12 is formed on an electrode pad locally formed on Cu wiring. Namely, in cases in which a Sn—Ag solder bump 12 is formed through the nickel layer 20 on a Cu electrode pad locally formed to the wiring, the nickel layer is formed corresponding to a limited part of the electrode pad. Thus, both connection reliability and conductivity between the electrode pad and the solder bump can be achieved even in cases in which an electrode pad is employed.

What is claimed is:

1. A semiconductor device comprising:
a terminal that is formed using copper, that is electrically connected to a circuit element, and that includes a formation face formed with a silver-tin solder bump such that a nickel layer is interposed between the terminal and the solder bump,
wherein the nickel layer is formed on a region corresponding to part of the formation face, and the solder bump is formed directly at another region of the formation face of the terminal,
the formation face has a circular shape in plan view, and
the nickel layer is formed in an annular-shaped region that is concentric to the formation face, and an outer circumference of the annular-shaped region is disposed so as to run along an outer circumference of the formation face.

2. The semiconductor device of claim 1, wherein a surface area of the region formed with the nickel layer corresponds to at least one third of a surface area of the formation face.

3. The semiconductor device of claim 1, further comprising:
the circuit element formed on a semiconductor substrate; and
a pad connected to the circuit element by first wiring,
wherein the terminal is formed on the pad.

4. The semiconductor device of claim 2, further comprising:
the circuit element formed on a semiconductor substrate; and
a pad connected to the circuit element by first wiring,
wherein the terminal is formed on the pad.

5. The semiconductor device of claim 1, further comprising:
the circuit element formed on a semiconductor substrate;
a pad connected to the circuit element by first wiring; and
a layer of second wiring connected to the pad,
wherein the terminal is formed on the second wiring.

6. The semiconductor device of claim 2, further comprising:
the circuit element formed on a semiconductor substrate;
a pad connected to the circuit element by first wiring; and
a layer of second wiring connected to the pad,
wherein the terminal is formed on the second wiring.

7. The semiconductor device of claim 3, further comprising:
- a second circuit element formed on the semiconductor substrate;
- a second pad connected to the second circuit element by second wiring; and
- a layer of second wiring connected to the second pad,
- wherein a second terminal is formed on the second wiring.

8. A semiconductor device comprising:
- a terminal that is formed using copper and that is electrically connected to a circuit element;
- a nickel layer that is formed on a region corresponding to part of an upper face of the terminal; and
- a silver-tin solder bump that is formed directly on exposed copper at the upper face of the terminal and also on an upper portion of the nickel layer,
- wherein the upper face of the terminal has a circular shape in plan view, and
- the nickel layer is formed in an annular-shaped region that is concentric to the upper face, and an outer circumference of the annular-shaped region is disposed so as to run along an outer circumference of the upper face.

9. A semiconductor device manufacturing method comprising:
- a process of forming a circuit element including wiring on a semiconductor wafer, the circuit element including an opening corresponding to part of the wiring so as to externally expose the wiring;
- a process of forming a terminal at the opening using copper;
- a process of forming a nickel layer on part of an upper face of the terminal; and
- a process of forming a silver-tin solder bump on an upper portion of the nickel layer and directly on another part of the upper face of the terminal,
- wherein the upper face of the terminal has a circular shape in plan view, and
- the nickel layer is formed in an annular-shaped region that is concentric to the upper face, and an outer circumference of the annular-shaped region is disposed so as to run along an outer circumference of the upper face.

* * * * *